(12) United States Patent
Meng

(10) Patent No.: US 12,683,112 B2
(45) Date of Patent: Jul. 14, 2026

(54) ION GENERATORS OF ION IMPLANTERS WITH MOVABLE REPELLER

(71) Applicant: Taiwan Semiconductor Manufacturing Company, Ltd., Hsinchu (TW)

(72) Inventor: Ying-Chieh Meng, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 395 days.

(21) Appl. No.: 18/362,897

(22) Filed: Jul. 31, 2023

(65) Prior Publication Data

US 2025/0046561 A1     Feb. 6, 2025

(51) Int. Cl.
*H01J 37/08* (2006.01)
*H01J 37/317* (2006.01)

(52) U.S. Cl.
CPC ........... *H01J 37/08* (2013.01); *H01J 37/3171* (2013.01)

(58) Field of Classification Search
CPC .............................. H01J 37/08; H01J 37/3171
See application file for complete search history.

(56) References Cited

U.S. PATENT DOCUMENTS 11,251,010 B1 * 2/2022 Perel ........................ H01J 37/08
2007/0114435 A1   5/2007 Kwon et al.

2013/0249400 A1 * 9/2013 Sato ...................... H01J 27/024
                                                          315/111.81
2014/0076715 A1 * 3/2014 Gorokhovsky ......... C23C 14/32
                                                          204/192.12
2022/0359147 A1 * 11/2022 Wright .................... H01J 27/08

FOREIGN PATENT DOCUMENTS

TW       201913711 A      4/2019
TW       202040650 A      11/2020

OTHER PUBLICATIONS

The first Office Action received in the corresponding Taiwan application 113100676, mailed on Jun. 26, 2024.

* cited by examiner

*Primary Examiner* — Georgia Y Epps
*Assistant Examiner* — Hanway Chang
(74) *Attorney, Agent, or Firm* — Kilpatrick Townsend & Stockton LLP

(57)                    ABSTRACT

An ion generator of an ion implanter is provided. The ion generator includes: an arc chamber defined by an arc chamber housing extending in a traveling direction; a filament configured to generate thermal electrons; a cathode disposed at a first end of the arc chamber housing in the traveling direction and configured to generate secondary electrons in response to bombardment of the thermal electrons generated by the filament; and a repeller disposed at a second end, opposite to the first end, of the arc chamber housing in the traveling direction, wherein the repeller is movable with respect to the arc chamber housing.

20 Claims, 9 Drawing Sheets

700

Measure a consumption depth of the cathode and a consumption
depth of the repeller
702

Calculate at least one of a displacement of the cathode and a
displacement of the repeller
704

Move at least one of the cathode and the repeller
706

ION GENERATORS OF ION IMPLANTERS WITH MOVABLE REPELLER

FIELD

Embodiments of the present disclosure relate generally to ion implanters, and more particularly to ion generators of ion implanters.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulting from iterative reduction of minimum feature size, which allows more components to be integrated into a given area.

While some integrated device manufacturers (IDMs) design and manufacture integrated circuits (IC) themselves, fabless semiconductor companies outsource semiconductor fabrication to semiconductor fabrication plants or foundries. Semiconductor fabrication consists of a series of processes in which a device structure is manufactured by applying a series of layers onto a substrate. This involves the deposition and removal of various thin film layers. The areas of the thin film that are to be deposited or removed are controlled through photolithography. Each of the deposition and removal processes is generally followed by cleaning as well as inspection steps. Therefore, both IDMs and foundries rely on numerous semiconductor equipment and semiconductor fabrication materials, often provided by vendors. There is always a need for customizing or improving those semiconductor equipment and semiconductor fabrication materials, which results in more flexibility, reliability, and cost-effectiveness.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION OF THE DISCLOSURE

Figure 1:
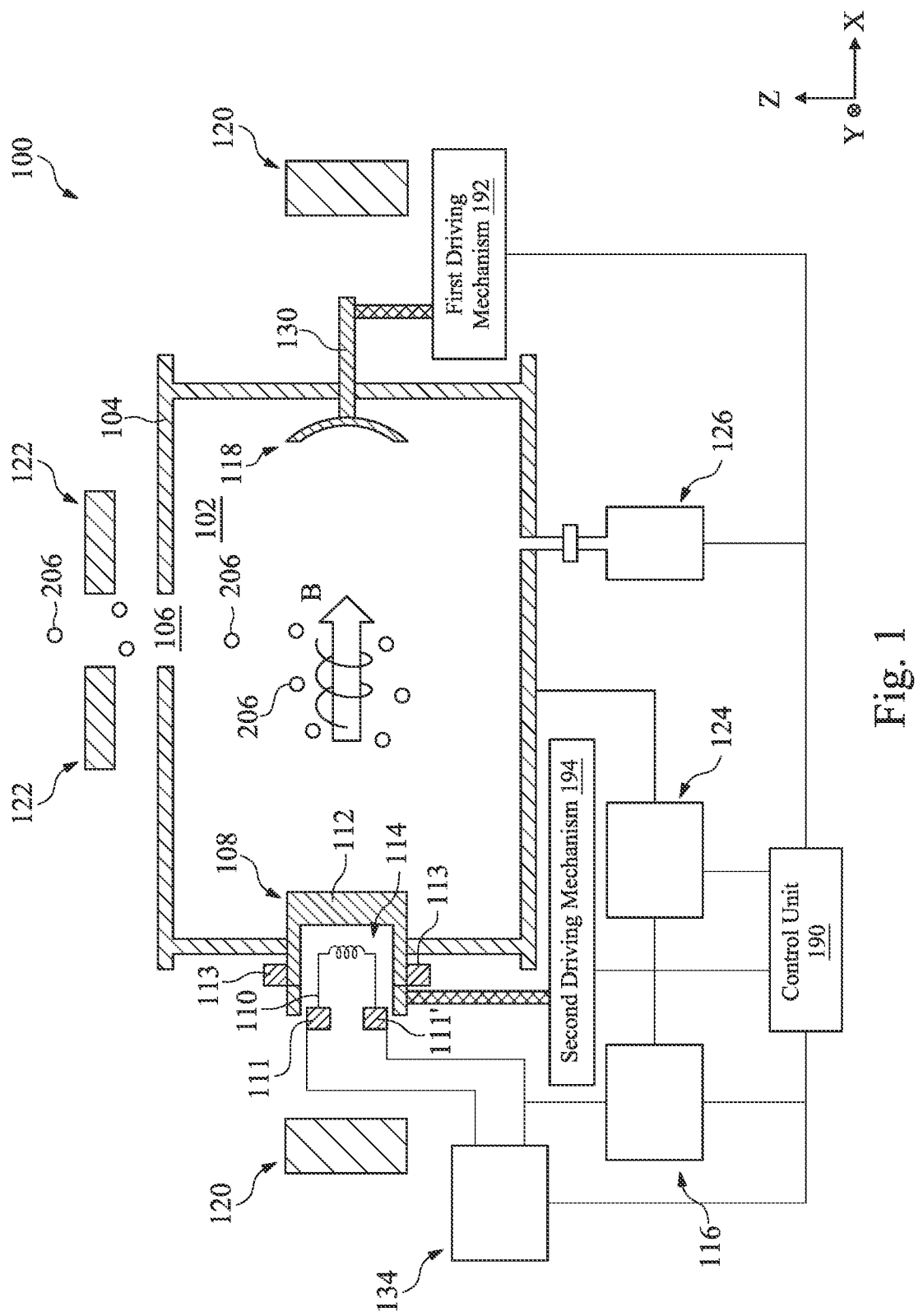
FIG. 1 is a diagram illustrating an example ion generator in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, source/drain region(s) may refer to a source or a drain, individually or collectively dependent upon the context. For example, a device may include a first source/drain region and a second source/drain region, among other components. The first source/drain region may be a source region, whereas the second source/drain region may be a drain region, or vice versa. One of ordinary skill in the art would recognize many variations, modifications, and alternatives.

Some embodiments of the disclosure are described. Additional operations can be provided before, during, and/or after the stages described in these embodiments. Some of the stages that are described can be replaced or eliminated for different embodiments. Some of the features described below can be replaced or eliminated and additional features can be added for different embodiments. Although some embodiments are discussed with operations performed in a particular order, these operations may be performed in another logical order.

Overview

Ion implantation is a low-temperature process by which ions of one element are accelerated into a solid target, thereby changing the physical, chemical, or electrical properties of the target. Ion implantation is widely used in semiconductor device fabrication. Semiconductor doping with boron, phosphorus, or arsenic is a common application of ion implantation. When implanted in a semiconductor, each dopant atom can create a charge carrier in the semiconductor after annealing. A hole can be created for a p-type dopant, and an electron for an n-type dopant. This modifies the conductivity of the semiconductor in its vicinity. In addition, ion implantation is used for preparing silicon on insulator (SOI) substrates from conventional bulk silicon substrates. A buried high does oxygen implant is converted, in a SIMOX (separation by implantation of oxygen) process, to silicon oxide by a high temperature annealing process.

An ion implanter generally includes an ion generator to generate an ion beam, ion beam transport optics for accelerating the ion beam, and a process chamber where the ion implantation on a semiconductor wafer occurs. The ions are mostly positively charged. During ion implantation, the charged ion beam strikes the semiconductor wafers in the process chamber, resulting in a doped semiconductor wafer when the dopant ions diffuse into the wafer.

A repeller (sometimes also referred to as a "anticathode") is often coupled to a housing of an ion source arc chamber (sometimes also referred to as an "arc chamber"). The repeller is used to "repell" electrons generated from a cathode in conjunction with a filament so that the electrons generated from the cathode travels back and forth, in a traveling direction perpendicular to the cathode, in the arc chamber. As a result, the chance of the electrons to collide with the molecules of the gas introduced into the arc chamber increases due to the increased traveling distance. Accordingly, more ions are generated in the arc chamber because of more collision.

However, the geometric sizes in the arc chamber is fixed once all components of the ion generator are assembled. After being used for a while, the consumption of the filament, the cathode, and the repeller may result in changed geometric sizes in the arc chamber. For example, the distance between the cathode and the repeller in the traveling direction may increase because of the consumption of the cathode and the repeller. The best position or shape of the plasma generated in the arc chamber may, therefore, shift or change accordingly. In order to compensate this shift or change, a larger driving current, a higher bias voltage, and an increased gas flow rate are employed.

In accordance with some aspects of the disclosure, an ion generator of an ion implanter is provided. The ion generator includes: an arc chamber defined by an arc chamber housing extending in a traveling direction; a filament configured to generate thermal electrons; a cathode disposed at a first end of the arc chamber housing in the traveling direction and configured to generate secondary electrons in response to bombardment of the thermal electrons generated by the filament; and a repeller disposed at a second end, opposite to the first end, of the arc chamber housing in the traveling direction. The repeller is movable with respect to the arc chamber housing. The movement of the repeller can compensate the shift of or change in the best position or shape of the plasma generated in the arc chamber due to the consumption of the cathode and the repeller. As a result, aging effect is minimized, maintenance count is reduced, the lifespan of components of the ion generator 100 is prolonged, the usage of expensive or toxic reactant gas is reduced.

In some embodiments, the repeller is curved rather than flat. In one example, the repeller includes: a front surface facing the cathode; and a back surface opposite to the front surface. The front surface is a concave surface viewing from the cathode, and the back surface is a convex surface viewing toward the cathode. Accordingly, the traveling path and the traveling time of secondary electrons are increased, thereby increasing the number of collisions. The bulk plasma region is enlarged in a plane perpendicular to the traveling direction. Plasma density and ion density are increased as well.

Example Ion Generator

FIG. 1 is a diagram illustrating an example ion generator in accordance with some embodiments. The ion generator 100 may be used in an ion implanter, such as an inductively heated cathode (IHC) ion generator used in high current ion implantation equipment.

In the example shown in FIG. 1, the ion generator 100 includes an (ion source) arc chamber 102 in accordance with some embodiments. In addition, the arc chamber 102 has an arc chamber housing 104 and an extraction opening 106 at a side of the arc chamber housing 104. The extraction opening 106 is configured to extract or expel ions and/or other impurities generated in the arc chamber 102. The arc chamber housing 104 may be made of a conductive material with a high melting point, so that the arc chamber housing 104 can be used under high-temperature conditions. Materials for forming the arc chamber housing 104 may include, but are not limited to, tungsten (W), molybdenum (Mo), and tantalum (Ta), an alloy of thereof, or graphite (C), although other conductive materials may additionally or alternatively be used to form the arc chamber housing 104.

A thermal electron emitter 108 is coupled to one side, in a first horizontal direction (i.e., the X-direction shown in FIG. 1), of the arc chamber housing 104 and is configured to emit thermal electrons into the arc chamber 102, as shown in FIG. 1. In some embodiments, the thermal electron emitter 108 includes a filament 110 and a cathode 112.

In the example shown in FIG. 1, the cathode 112 extrudes into the arc chamber 102 from outside the arc chamber housing 104, so that one end of the cathode is positioned in the arc chamber 102 while the other end of the cathode is positioned outside of arc chamber 102. In some embodiments, a clamp 113 is clamped onto two sides of the cathode 112 to enhance the stability of the cathode 112.

In the example shown in FIG. 1, the filament 110 is positioned in a hollow region 114 of the cathode 112 but is not in physical contact with the cathode 112. In some embodiments, clamps 111 and 111' are clamped on two ends of the filament 110 that extend outside the cathode 112 to enhance the stability of the filament 110. A filament power supply 134 is electrically connected to the clamps 111 and 111' to provide power to the filament 110.

The filament 110 is configured to generate thermal electrons. More specifically, the filament 110 is energized by the filament power supply 134 and the current passing through the filament 110 heats the filament 110 to produce thermal electrons. When the filament 110 is heated to a thermionic emission temperature by the filament power supply 134, thermal electrons generated by the filament 110 are emitted.

A bias power supply 116 is used to bias the cathode 112 so the thermal electrons emitted from the filament 110 can be accelerated toward the cathode 112. As these thermal electrons bombard the cathode 112, the cathode 112 will emit secondary electrons into the arc chamber 102. In some embodiments, the cathode 112 is also heated to a thermionic emission temperature, and thermal electrons are emitted from the cathode 112 in addition to the secondary electrons. Unless expressly stated, secondary electrons are discussed as the primary electrons emitted by the cathode 112 throughout the disclosure, but a person of ordinary skill in the art should understand that additional thermal electrons emitted by the cathode 112 also exist and contribute to the production of plasma and ions.

In addition, an arc chamber power supply 124 is electrically connected to the arc chamber housing 104. The arc chamber power supply 124 is configured to bias the arc chamber housing 104 with respect to the cathode 112, so that the secondary electrons (and the thermal electrons in some embodiments where the cathode 112 is also heated) emitted by the cathode 112 are accelerated in the arc chamber 102. Therefore, the secondary electrons emitted by the cathode 112 gain high kinetic energies, and plasma is formed within the arc chamber 102 as a result of the collision between the secondary electrons with the molecules of the reactant gas introduced into the arc chamber 102.

A repeller 118 (or anticathode) is coupled to the arc chamber housing 104. A shaft 130 is attached to the repeller 118. In the example shown in FIG. 1, the thermal electron emitter 108 is positioned at one side, in the X-direction, of the arc chamber housing 104, and the repeller 118 is positioned at the opposite side, in the X-direction, of the arc chamber housing 104. In addition, the repeller 118 at the other end of the arc chamber housing 104 may be biased at the same or a similar potential as the cathode 112 to repel energetic thermal electrons in the arc chamber 102. Materials for forming the repeller 118 may include, but are not limited to, tungsten, although other conductive materials may additionally or alternatively be used to form the repeller 118. As discussed above, the repeller 118 repels the secondary electrons in the X-direction and increases the traveling time of the secondary electrons. Accordingly, additional ionizing collisions can be achieved.

As will be discussed in greater detail below with reference to FIGS. 2, 3, 4, 5A, and 5B, the repeller 118 is not flat. In some embodiments, the repeller 118 has a curved front surface facing the cathode 112. In one example, the repeller 118 has a "bowl-type shape". As will be discussed below, the spherical cap shape of the repeller 118 can increase plasma density and, therefore, ion density in the arc chamber 102.

In the example shown in FIG. 1, source magnets 120 are provided outside the arc chamber 102. The source magnets 120 are configured to produce a magnetic field within the arc chamber 102 and, therefore, to confine the thermal electrons formed in the arc chamber 102. It should be noted that, although two source magnets 120 are illustrated in FIG. 1, one or more than two source magnets 120 may be utilized for generating a magnetic field in other embodiments.

In the example shown in FIG. 1, a magnetic field in the X-direction is formed, which is denoted as "B" in FIG. 1. As a result, the secondary electrons formed in the arc chamber 102 follow a spiral trajectory, which is shown in FIG. 1 as a helical path. Specifically, secondary electrons move in circles in the plane (i.e., the Y-Z plane shown in FIG. 1) perpendicular to the magnetic field and move from left to right in the direction of the magnetic field (i.e., the X-direction shown in FIG. 1, also referred to as the "traveling direction"). The helical path increases the traveling length and traveling time of the secondary electrons, thereby increasing the number of ionizing collisions.

In the example shown in FIG. 1, a gas source 126 is coupled to the arc chamber housing 104. The gas source 126 is configured to introduce a gas to the arc chamber 102. In some embodiments, the gas source 126 includes one or more gas bottles or reservoirs. In some other embodiments, the gas source 126 includes an oven that heats up a substance to produce a desired gas. In some embodiments, the gas source 126 is configured to apply a reactant gas and a diluent gas (e.g., hydrogen) into the arc chamber 102. In some examples, the reactant gas is a dopant gas such as one of the following: carbon dioxide ($CO_2$), carbon monoxide (CO), germanium tetrafluoride ($GeF_4$), boron trifluoride ($BF_3$), difluoroboron ($BF_2$), oxygen ($O_2$), phosphine ($PH_3$), ammonia ($NH_3$), and arsine ($AsH_3$). Among these exemplary types of reactant gas, germanium tetrafluoride and boron trifluoride are relatively expensive, while phosphine and arsine are very toxic. Therefore, it is beneficial to decrease the usage of these reactant gas.

The reactant gas and the diluent gas may be introduced to the arc chamber 102 via the same conduit. That is, the reactant gas and the diluent gas are pre-mixed in the conduit before entering the arc chamber 102. Alternatively, the reactant gas and the diluent gas may be introduced into the arc chamber 102 via different conduits. That is, the reactant gas and the diluent gas are mixed in the arc chamber 102.

Ions 206 of the reactant gas are therefore produced in the arc chamber 102. In the example shown in FIG. 1, extraction electrodes 122 are positioned in front of the extraction opening 106 outside the arc chamber 102. The extraction electrodes 122 are configured to extract ions 206 from the plasma formed in the arc chamber 102. More specifically, the ions 206 of the reactant gas are extracted from the arc chamber 102 through the extraction aperture 106 by the extraction electrodes 122. These ions 206 are subsequently directed and accelerated by the implanter for the ion implantation on a semiconductor wafer.

A control unit 190 is electrically connected to various components of the ion generator 100, including, but not limited to, the filament power supply 134, the bias power supply 116, the arc chamber power supply 124, the gas source 126, the first driving mechanism 192, and the second driving mechanism 194. The control unit 190 is configured to control the operation of the ion generator 100 by adjusting various operational parameters thereof. Details of the control unit 190 will be discussed below.

The first driving mechanism 192 is configured to drive the repeller 118 through, for example, a shaft 130 so that the repeller 118 can move in the X-direction (i.e., the traveling direction) with respect to the arc chamber housing 104. The second driving mechanism 194 is configured to drive the cathode 112 (and the filament 110 in some embodiments) so that the cathode 112 can move in the X-direction (i.e., the traveling direction) with respect to the arc chamber housing 104. The first driving mechanism 192 and the second driving mechanism 194 are controlled by the control unit 190. As will be discussed in greater detail below, the movement of at least one of the repeller 118 and the cathode 112 can compensate the shift of or change in the best position or shape of the plasma generated in the arc chamber 102 due to the consumption of the cathode 112 and the repeller 118. As a result, aging effect is minimized, maintenance count is reduced, the lifespan of components of the ion generator 100 is prolonged, the usage of expensive or toxic reactant gas is reduced.

Example Curved Repeller and the Operation Thereof

Figure 2:
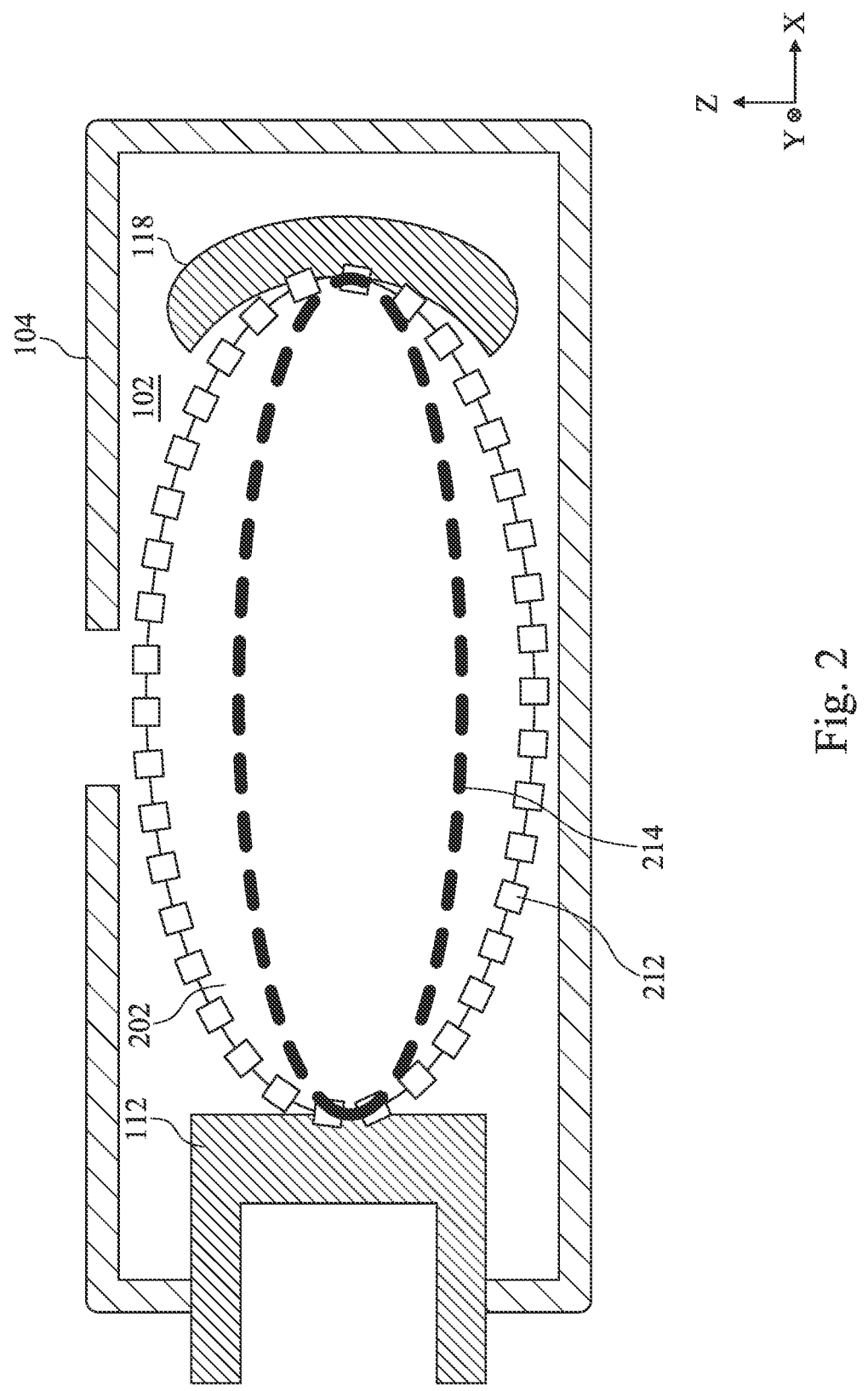
FIG. 2 is a diagram illustrating an example arc chamber with a curved repeller 118 in accordance with some embodiments.
Figure 3:
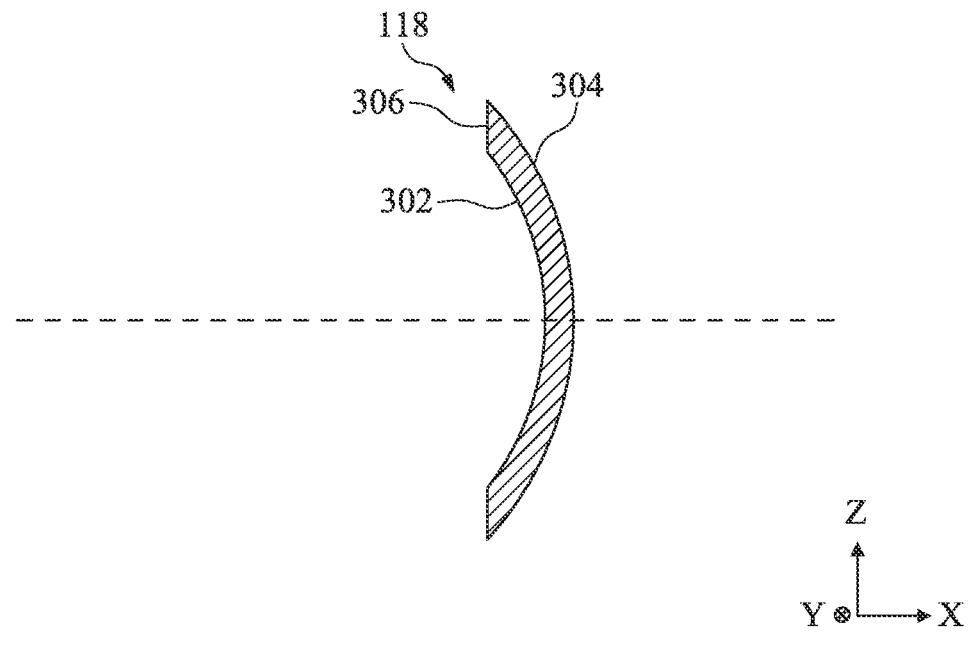
FIG. 3 is a diagram illustrating a side view of an example repeller in accordance with some embodiments.
Figure 4:
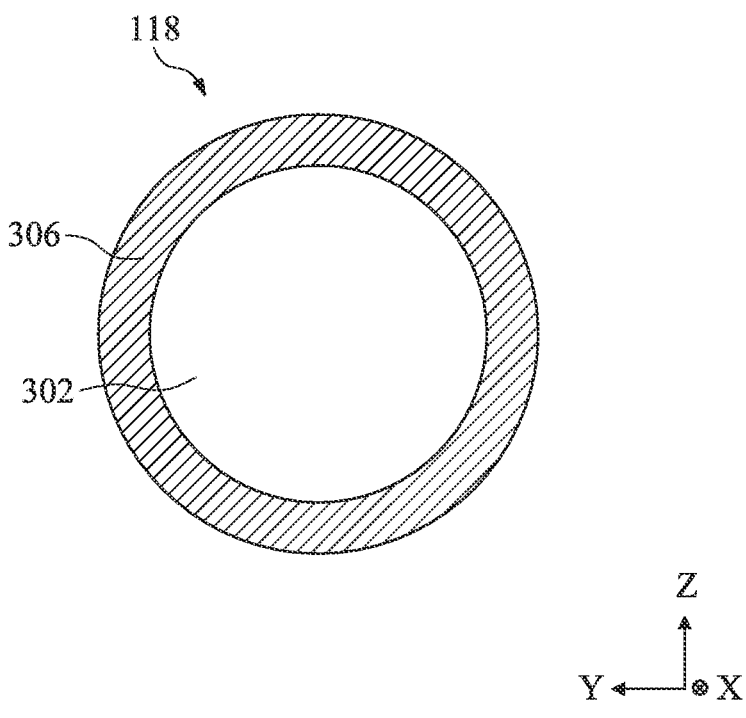
FIG. 4 is a diagram illustrating a front view of an example repeller in accordance with some embodiments.

FIG. 2 is a diagram illustrating an example arc chamber 102 with a repeller 118, which is curved, in accordance with some embodiments. FIG. 3 is a diagram illustrating a side view of an example repeller 118 in accordance with some embodiments. FIG. 4 is a diagram illustrating a front view of an example repeller 118 in accordance with some embodiments.

In the example shown in FIG. 2, a bulk plasma region 202 is formed in the arc chamber 102. The bulk plasma region 202 is quasi-neutral (i.e., the density of electrons and the density of ions are substantially the same). The bulk plasma region 202 has a boundary 212. The bulk plasma region 202 extends between the cathode 112 and the repeller 118 in the X-direction.

Compared to a conventional repeller, which is flat, the bulk plasma region 202 is larger in the Y-Z plane than a counterpart bulk plasma region, which has a boundary 214. The repeller 118 is curved. As a result, the electrical field generated by the repeller 118 has both a first component in the X-direction and a second component perpendicular to the X-direction. The second component results in a force that confines the secondary electrons in the Y-Z plane. Fewer secondary electrons hit the interior surfaces of the arc chamber housing 104 in a given time period. Accordingly, the traveling path and the traveling time of secondary electrons are increased, thereby increasing the number of collisions. The bulk plasma region 202 is enlarged in the Y-Z plane. Plasma density and ion density are increased as well.

In the example shown in FIGS. 3 and 4, the repeller 118 has a front surface 302 and a back surface 304. The front surface 302 is a concave surface viewing from the front (i.e., viewing from the cathode 112). The back surface 304 is a convex surface viewing from the back (i.e., viewing toward the cathode 112). The repeller 118 also has a circular band 306 viewing from the front. In some embodiments, the front surface 302 is a surface of a first spherical cap, and the back surface 304 is a surface of a second spherical cap, and the second spherical cap has a larger radius than that of the first spherical cap. The repeller 118, therefore, has a "bowl-type shape."

It should be understood that the front surface 302 and the back surface 304 do not have to be surfaces of spherical caps, other curved surfaces may be employed in other embodiments. In some embodiments, the repeller 118 may have a cone shape, a dish shape, or other suitable shapes.

Figure 5A:
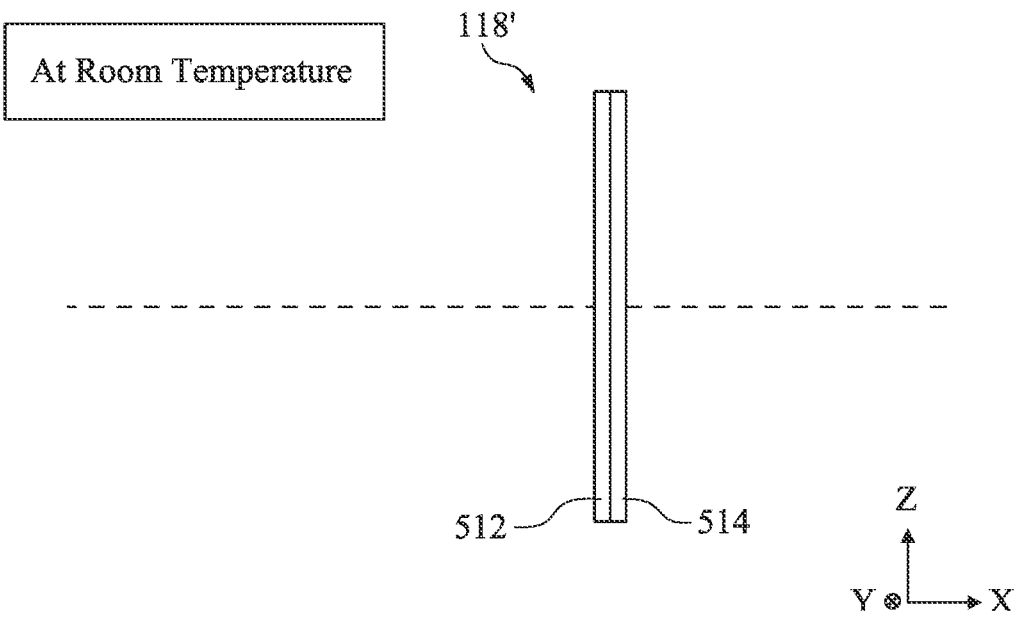
FIG. 5A is a diagram illustrating a side view of another example repeller at room temperature in accordance with some embodiments.
Figure 5B:
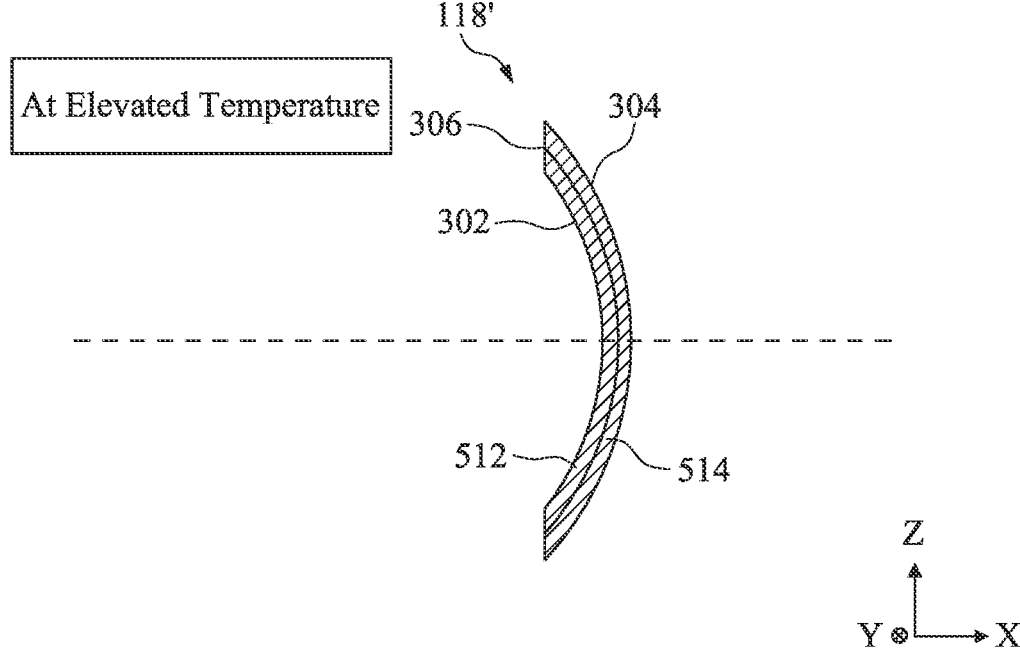
FIG. 5B is a diagram illustrating a side view of the example repeller shown in FIG. 5A at an elevated temperature in accordance with some embodiments.

FIG. 5A is a diagram illustrating a side view of another example repeller 118' at room temperature in accordance with some embodiments. FIG. 5B is a diagram illustrating a side view of the example repeller 118' shown in FIG. 5A at a higher temperature in accordance with some embodiments.

In the example shown in FIGS. 5A-5B, the repeller 118' does not have to be curved at room temperature. The repeller 118' has two metal layers, namely the first metal layer 512 and the second metal layer 514 coupled to each other. At room temperature, the repeller is substantially flat. However, the first metal layer 512 is made of a first metal having a first coefficient of thermal expansion (CTE), and the second metal layer 514 is made of a second metal having a second CTE different from the first CTE. When the temperature rises (e.g., either because of the operation of the arc chamber 102 or because of purposeful heating of the repeller 118') to an elevated temperature over the room temperature, the repeller 118' bends and becomes curved due to the difference between the first CTE and the second CTE. In one embodiment, the elevated temperature is between 1000 degree Celsius and 2000 degree Celsius. In another embodiment, the elevated temperature is between 1200 degree Celsius and 1800 degree Celsius. In yet another embodiment, the elevated temperature is between 1400 degree Celsius and 1600 degree Celsius. In another embodiment, the elevated temperature is about 1500 degree Celsius.

In one embodiment, the first metal is tungsten (W), and the second metal is molybdenum (Mo). In another embodiment, the first metal is molybdenum (Mo), and the second metal is tungsten (W). In other embodiments, the first metal and the second metal can be two of the following: niobium, molybdenum, tantalum, tungsten, rhenium, and an alloy.

Movement of the Repeller and the Cathode

Figure 6A:
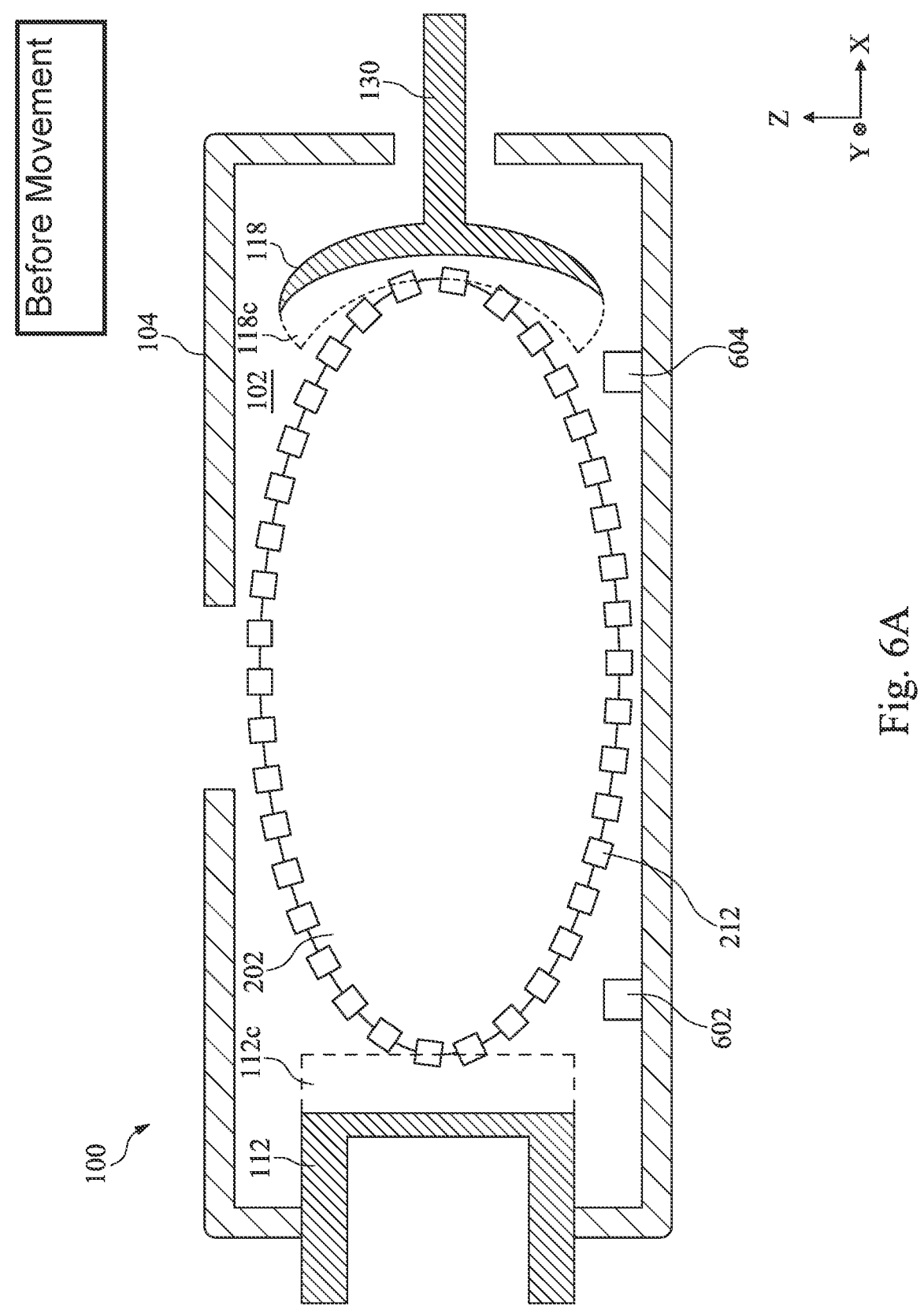
FIG. 6A is a diagram illustrating an example arc chamber before repeller or cathode movement in accordance with some embodiments.
Figure 6B:
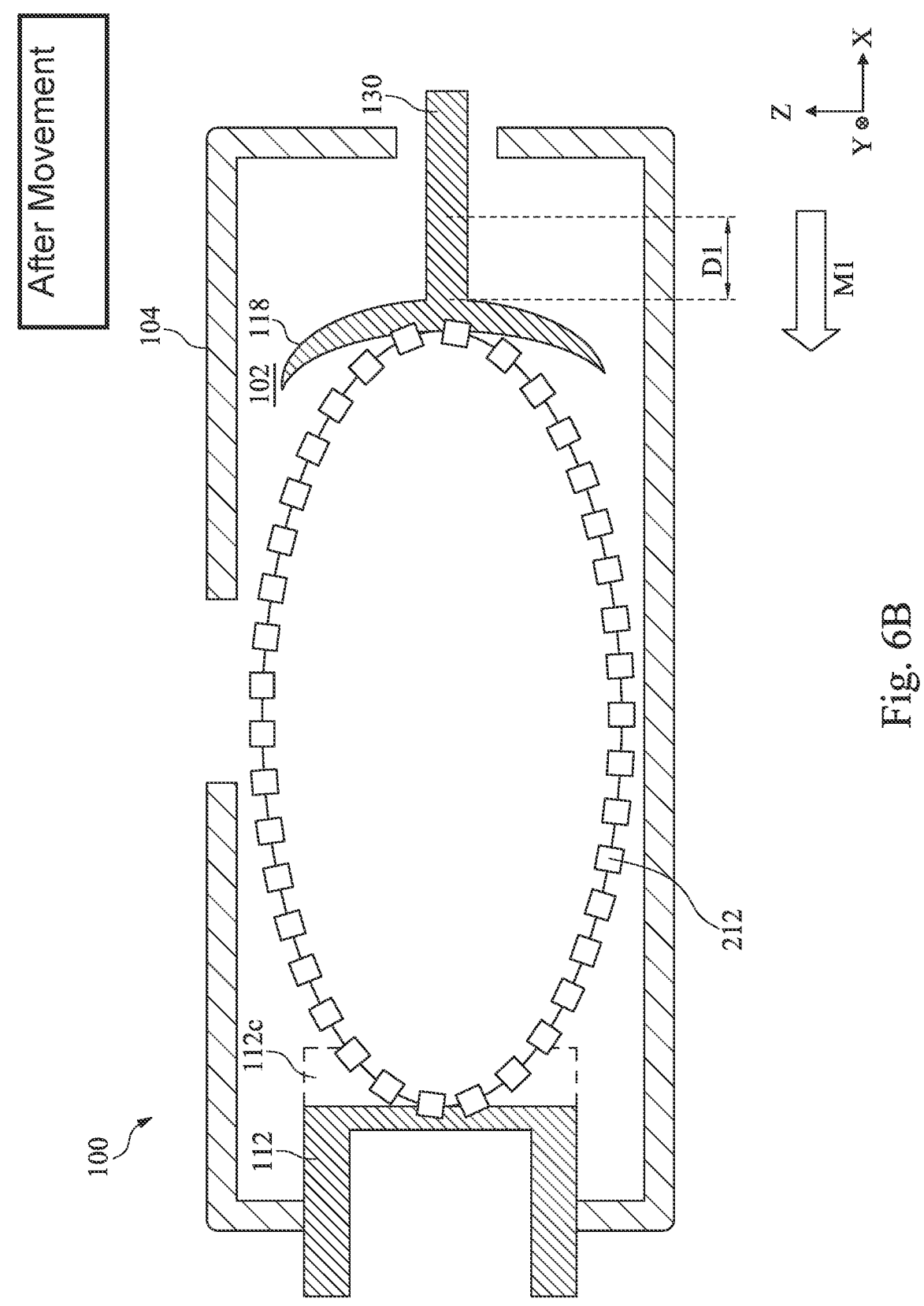
FIG. 6B is a diagram illustrating an example arc chamber after repeller or cathode movement in accordance with some embodiments.
Figure 6C:
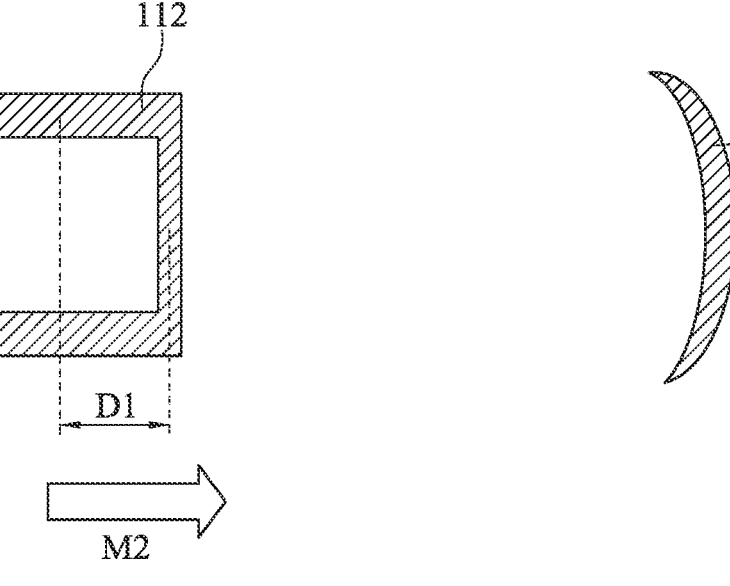
FIG. 6C is a diagram illustrating a side view of cathode movement in accordance with some embodiments.
Figure 6C:
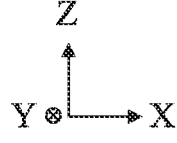
Figure 6D:
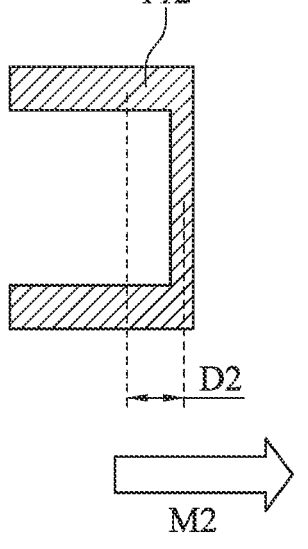
FIG. 6D is a diagram illustrating a side view of both repeller movement and cathode movement in accordance with some embodiments.
Figure 6D:
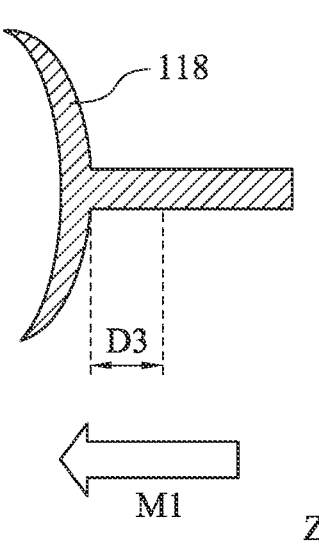
Figure 6D:
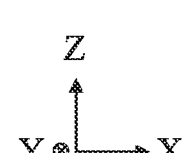

FIG. 6A is a diagram illustrating an example arc chamber 102 before repeller or cathode movement in accordance with some embodiments. FIG. 6B is a diagram illustrating an example arc chamber 102 after repeller or cathode movement in accordance with some embodiments. FIG. 6C is a diagram illustrating a side view of cathode movement in accordance with some embodiments. FIG. 6D is a diagram illustrating a side view of both repeller movement and cathode movement in accordance with some embodiments.

In the example shown in FIG. 6A, after the ion generator 100 operates for a certain period of time (e.g., 1 hour, 10 hours, 100 hours, etc.), the cathode 112 and the repeller 118 has been consumed. In the example shown in FIG. 6A, a consumed portion 112c of the cathode 112 has been consumed, and a consumed portion 118c of the repeller 118 has been consumed. As a result, the distance, in the traveling direction (i.e., the X-direction shown in FIG. 6A) between the cathode 112 and the repeller 118 increases. As a result, the best position or shape of the plasma generated in the arc chamber 102 is shifted or changed. There is a gap between the boundary 212 of the bulk plasma region 202 and the cathode 112; there is a gap between the boundary 212 of the bulk plasma region 202 and the repeller 118.

A consumption depth of the cathode 112 is the depth, in the traveling direction, of the consumption portion 112c; a consumption depth of the repeller 118 is the depth, in the traveling direction, of the consumption portion 118c. In the example shown in FIG. 6A, a distance sensor 602 is attached to the arc chamber housing 104 in proximity to the cathode 112, and a distance sensor 604 is attached to the arc chamber housing 104 in proximity to the repeller 118. The distance sensor 602 measures the consumption depth of the cathode 112; the distance sensor 604 measures the consumption depth of the repeller 118. In one implementation, the consumption depth of the cathode 112 or the repeller 118 is measured by calculating the change in distance between the distance sensor 602 and the cathode 112 or between distance sensor 604 and the repeller 118. Specifically, a first distance between the distance sensor 604 and the repeller 118 at a first moment is measured, and a second distance between the distance sensor 604 and the repeller 118 at a second moment after the first moment is measured, and then a difference between the first distance and the second distance is calculated.

In one embodiment, the distance sensors 602 and 604 are ultrasonic distance sensors (sometimes also referred to as "Sonar sensors"). High-frequency sound waves are emitted towards the cathode 112 or the repeller 118, and the reflected waves are picked up by the receiver of the ultrasonic distance sensors. In another embodiment, the distance sensors 602 and 604 are infrared (IR) distance sensors. Distance is measured based on the angle of the reflected IR light beam. In another embodiment, the distance sensors 602 and 604 are laser distance sensors. Distance is measured by using the constant speed of light in air and the time between emitting and receiving the laser light. In one example, the laser distance sensors are Light Detection and Ranging (LiDAR) sensors.

In the example shown in FIG. 6B, the repeller 118 is moved, in the traveling direction (i.e., the X-direction shown in FIG. 6B), toward the cathode 112 by a displacement D1. The movement is denoted as "M1" in FIG. 6B. The displacement D1 is a function of the depth, in the traveling direction, of the consumed portion 112c and the depth of the consumed portion 118c shown in FIG. 6A. In one example, the displacement is the sum of the depth of the consumed portion 112*c* and the depth of the consumed portion 118*c*. By compensating the consumption of the cathode 112 and the repeller 118, the best position or shape of the plasma generated in the arc chamber 102 can be maintained.

In the example shown in FIG. 6B, displacement D1 of the repeller 118 is achieved by moving the shaft 130, which is attached to the repeller 118. The shaft 130 is moved by the first driving mechanism 192 shown in FIG. 1, which is controlled by the control unit 190 shown in FIG. 1. In one implementation, the first drive mechanism 192 is an actuator, a rail, a continuous track, a stepper motor, gears, belts, or a combination thereof. It should be understood that this is not intended to be limiting, and other implementations of the first drive mechanism 192 are within the scope of the disclosure. When the first driving mechanism 192 receives instructions, from the control unit 190, to move a calculated displacement, it drives the shaft 130 the calculated displacement.

Although it is shown as a displacement in the X-direction in the example shown in FIG. 6B, it should be understood that the displacement can be both in the X-direction and in the Y-Z plane, when the consumption of the repeller 118 or the cathode 112 is not even in the X-Y plane for some reasons. In other words, the displacement or movement of the repeller 118 can be a three-dimensional displacement or movement in other embodiments.

In the example shown in FIG. 6C, the cathode 112, instead of the repeller 118, is moved. Specifically, the cathode 112 is moved, in the traveling direction (i.e., the X-direction shown in FIG. 6C), toward the repeller 118 by a displacement D1. The movement is denoted as "M2" in FIG. 6C. Likewise, the displacement D1 is a function of the depth, in the traveling direction, of the consumed portion 112*c* and the depth of the consumed portion 118*c* shown in FIG. 6A. In one example, the displacement is the sum of the depth of the consumed portion 112*c* and the depth of the consumed portion 118*c*. By compensating the consumption of the cathode 112 and the repeller 118, the best position or shape of the plasma generated in the arc chamber 102 can be maintained.

In the example shown in FIG. 6C, displacement D1 of the cathode 112 is achieved by moving, for example, a shaft that is attached to the cathode 112. The shaft is moved by the second driving mechanism 194 shown in FIG. 1, which is controlled by the control unit 190 shown in FIG. 1. In one implementation, the second drive mechanism 194 is an actuator, a rail, a continuous track, a stepper motor, gears, belts, or a combination thereof. It should be understood that this is not intended to be limiting, and other implementations of the second drive mechanism 194 are within the scope of the disclosure. When the second driving mechanism 194 receives instructions, from the control unit 190, to move a calculated displacement, it drives the shaft that is attached to the cathode 112 the calculated displacement.

Although it is shown as a displacement in the X-direction in the example shown in FIG. 6C, it should be understood that the displacement can be both in the X-direction and in the Y-Z plane, when the consumption of the repeller 118 or the cathode 112 is not even in the X-Y plane for some reasons. In other words, the displacement or movement of the cathode 112 can be a three-dimensional displacement or movement in other embodiments.

In the example shown in FIG. 6D, both the repeller 118 and the cathode 112 are moved. Specifically, the repeller 118 is moved, in the traveling direction (i.e., the X-direction shown in FIG. 6D), toward the cathode 112 by a third displacement D3. The movement is denoted as "M1" in FIG.

6D. The cathode 112 is moved, in the traveling direction (i.e., the X-direction shown in FIG. 6D), toward the repeller 118 by a second displacement D2. The movement is denoted as "M2" in FIG. 6D. The sum of the second displacement D2 and the third displacement D3 is equal to the displacement D1. Likewise, the sum of the second displacement D2 and the third displacement D3 is a function of the depth, in the traveling direction, of the consumed portion 112*c* and the depth of the consumed portion 118*c* shown in FIG. 6A. In one example, the sum of the second displacement D2 and the third displacement D3 is the sum of the depth of the consumed portion 112*c* and the depth of the consumed portion 118*c*. By compensating the consumption of the cathode 112 and the repeller 118, the best position or shape of the plasma generated in the arc chamber 102 can be maintained.

In the example shown in FIG. 6D, the second displacement D2 of the cathode 112 is achieved by moving, for example, a shaft that is attached to the repeller 118. The shaft is moved by the second driving mechanism 194 shown in FIG. 1, which is controlled by the control unit 190 shown in FIG. 1. On the other hand, the third displacement D3 of the repeller 118 is achieved by moving the shaft 130, which is attached to the repeller 118. The shaft 130 is moved by the first driving mechanism 192 shown in FIG. 1, which is controlled by the control unit 190 shown in FIG. 1.

Figure 7:
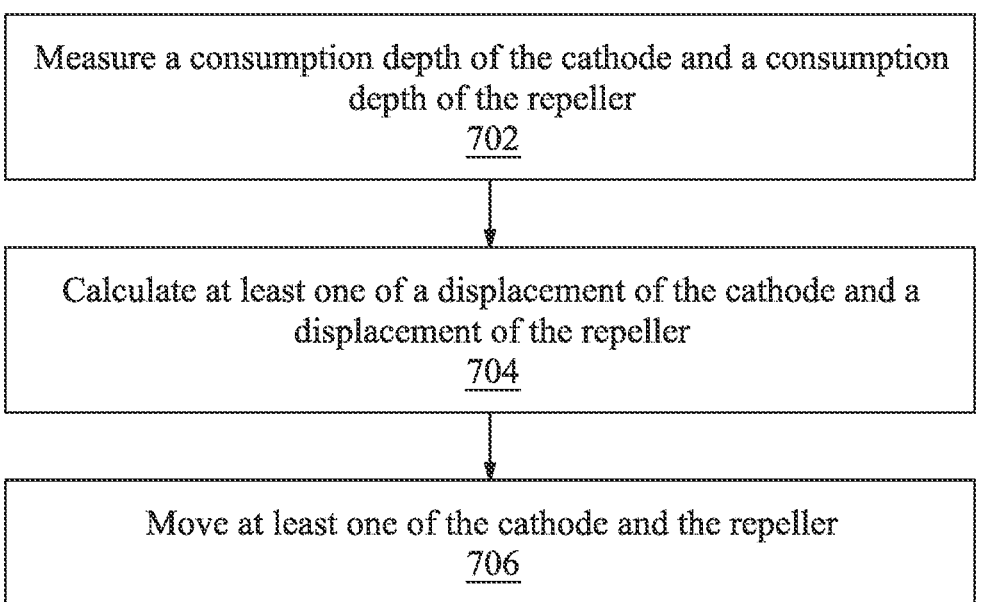
FIG. 7 is a flowchart diagram illustrating a method for compensating the consumption of cathode and repeller in accordance with some embodiments.

FIG. 7 is a flowchart diagram illustrating a method 700 for compensating the consumption of cathode and repeller in accordance with some embodiments. In the example shown in FIG. 7, the method 700 includes operations 702, 704, and 706. Additional operations may be performed.

At operation 702, a consumption depth of the cathode 112 and a consumption depth of the repeller 118 is measured. The consumption depth of the cathode 112 is the depth, in the traveling direction, of the consumption portion 112*c* shown in FIG. 6A; the consumption depth of the repeller 118 is the depth, in the traveling direction, of the consumption portion 118*c* shown in FIG. 6A. In one implementation, the consumption depth of the cathode 112 is measured by the distance sensor 602 fixed on the arc chamber housing 104 shown in FIG. 6A; the consumption depth of the repeller 118 is measured by the distance sensor 604 fixed on the arc chamber housing 104 shown in FIG. 6A.

At operation 704, at least one of a displacement of the cathode 112 and a displacement of the repeller 118 is calculated or determined based on the consumption depth of the cathode 112 and the consumption depth of the repeller 118. In one embodiment shown in FIG. 6B, only the repeller 118 is moved. Accordingly, only the displacement of the repeller 118 is calculated. In another embodiment shown in FIG. 6C, only the cathode 112 is moved. Accordingly, only the displacement of the cathode 112 is calculated. In yet another embodiment shown in FIG. 6C, both the cathode 112 and the repeller 118 are moved. Accordingly, both the displace of the cathode 112 and the displacement of the repeller 118 are calculated.

At operation 706, at least one of the cathode 112 and the repeller 118 is moved in accordance with the calculated displacement(s) at operation 704. In one embodiment shown in FIG. 6B, only the repeller 118 is moved in accordance with the displacement of the repeller 118. In another embodiment shown in FIG. 6C, only the cathode 112 is moved in accordance with the displacement of the cathode 112. In yet another embodiment shown in FIG. 6C, both the cathode 112 and the repeller 118 are moved in accordance with the displace of the cathode 112 and the displacement of the repeller 118, respectively.

Control Unit and Machine Learning

Figure 8:
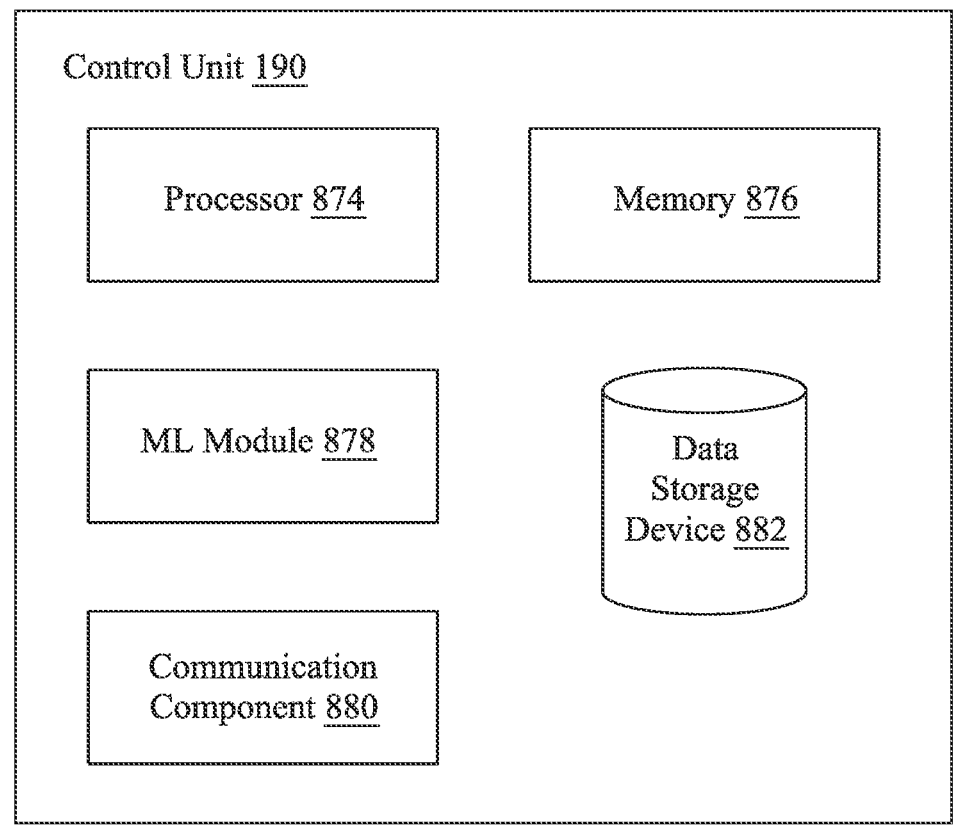
FIG. 8 is a diagram illustrating an example control unit in accordance with some embodiments.

FIG. 8 is a diagram illustrating an example control unit 190 in accordance with some embodiments. As discussed above, the control unit 190 is in electrical communication with various components of the ion generator 100 shown in FIG. 1, including the filament power supply 134, the bias power supply 116, the arc chamber power supply 124, the gas source 126, the first driving mechanism 192, the second driving mechanism 194. The control unit 190 is further in electrical communication with the distance sensors 602 and 604 shown in FIG. 6A. It should be understood that the control unit 190 may be in electrical communication with other components of the ion generator 100 as needed.

In the example shown in FIG. 8, the control unit 190 includes, among other components, a processor 874, a memory 876, a machine learning (ML) module 878, a communication component 880, and a data storage device 882. The control unit 190 is generally configured to receive signals from other components of the ion generator 100, process the signals, calculate a real-time adjustment value of an operational parameter or characteristic, transform the real-time adjustment value to an adjustment signal, and transmit the adjustment signals to other components of the ion generator 100.

The processor 874 is configured to process and analyze signals and execute instructions saved in the memory. In some embodiments, the processor 874 is a central processing unit (CPU), a multi-core processor, a distributed processing system, an application specific integrated circuit (ASIC), and/or a suitable processing unit.

The memory 876 is configured to store temporary variables or other intermediate information during signal processing by the processor 874. In some embodiments, the memory 876 is a random-access memory (RAM) such as static random-access memory (SRAM).

The data storage device 882 is configured to store any information related to the operation of the ion generator 100, such as the consumption depth of the cathode 112 and the consumption depth of the repeller 118 discussed above with reference to FIG. 6A. In some embodiments, the data storage device 882 is an electronic, magnetic, optical, electromagnetic, infrared, and/or a semiconductor system (or apparatus or device). For example, the data storage device 882 includes a semiconductor or solid-state memory, a magnetic tape, a removable computer diskette, a random-access memory (RAM), a read-only memory (ROM), a rigid magnetic disk, and/or an optical disk. In some embodiments using optical disks, the data storage device 882 includes a compact disk-read only memory (CD-ROM), a compact disk-read/write (CD-R/W), and/or a digital video disc (DVD).

The communication component 880 allows software and data to be transferred between the control unit 190 and external components, such as the distance sensors 602 and 604 shown in FIG. 6A, the first driving mechanism 192 shown in FIG. 1, and the second driving mechanism 194 shown in FIG. 1. The communications component 880 can include a modem, a network interface (such as an Ethernet card), a communications port, or the like. Software and data transferred via the communication component 880 are in the form of signals which may be electronic, electromagnetic, optical, or other signals capable of being received by the communication component. These signals are provided to the communication component 880 via a communications path, which can be implemented using wire or cable, fiber optics, a phone line, a cellular phone link, a RF link, or other communications channels.

The machine learning (ML) module 878 has a machine learning algorithm configured to establish and improve an operational model for at least one operational parameter and/or a relationship between or among multiple operational parameters. The operational model may be trained by the machine learning module 878 based on a priori data generated from prior operations, with respect to a certain type of arc chamber 102 in conjunction with operational parameters of the cathode 112, the repeller 118. These priori data may be stored externally and are accessible to the machine learning module 878 through the communication component 880. Alternatively, these priori data may be stored internally in the data storage device 882. Datasets (e.g., training datasets, testing datasets, etc.) are, therefore, accessible to the machine learning module 878 for training and testing.

Conventionally, operational parameters such as the power (or voltage, or current) provided to the filament 110, the bias voltage applied to the cathode 112, the bias voltage applied to the arc chamber housing 104, and the flow rate of the gas source 126 are used for tuning to achieve the best position or shape of the plasma generated in the arc chamber 102. In accordance with the embodiments disclosed herein, however, additional operational parameters such as the consumption depth of the cathode 112, the consumption depth of the repeller 118, the displacement of the cathode 112, the displacement of the repeller 118, the shape (e.g., the curvature of the front surface 302 shown in FIG. 3) of the repeller 118 can be used for tuning. As a result, the tuning becomes quicker and more accurate, and more tuning latitude can be achieved thanks to the additional operational parameters.

The pre-established operation model generated by the machine learning module 878 can be used as a standard or reference for the processor 874 to (i) determine the recommended combination of operational parameters; (ii) determine the deviation between the current values and the recommended values of the operational parameters; (iii) generate real-time adjustment signals that will be received by corresponding components (e.g., the first driving mechanism 192 and the second driving mechanism 194 shown in FIG. 1). As such, during the operation of the ion generator 100, if a real-time adjustment is needed, the control unit 190 will instantaneously transmit real-time adjustment signals to corresponding components in situ through the communication component 880.

SUMMARY

In accordance with some aspects of the disclosure, an ion generator of an ion implanter is provided. The ion generator includes: an arc chamber defined by an arc chamber housing extending in a traveling direction; a filament configured to generate thermal electrons; a cathode disposed at a first end of the arc chamber housing in the traveling direction and configured to generate secondary electrons in response to bombardment of the thermal electrons generated by the filament; and a repeller disposed at a second end, opposite to the first end, of the arc chamber housing in the traveling direction, wherein the repeller is movable with respect to the arc chamber housing.

In accordance with some aspects of the disclosure, an ion generator of an ion implanter is provided. The ion generator includes: an arc chamber defined by an arc chamber housing extending in a traveling direction; a filament configured to generate thermal electrons; a cathode disposed at a first end of the arc chamber housing in the traveling direction and configured to generate secondary electrons in response to bombardment of the thermal electrons generated by the filament; and a repeller disposed at a second end, opposite to the first end, of the arc chamber housing in the traveling direction, wherein the repeller is curved.

In accordance with some aspects of the disclosure, a method for operating an ion generator of an ion implanter is provided. The method includes: measuring a consumption depth of a cathode and a consumption depth of a repeller; determining, based on the consumption depth of the cathode and the consumption depth of the repeller, at least one of a displacement of the repeller and a displacement of the cathode; and moving at least one of the cathode and the repeller in accordance with the at least one of the displacement of the repeller and the displacement of the cathode.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An ion generator of an ion implanter, the ion generator comprising:
an arc chamber defined by an arc chamber housing extending in a traveling direction;
a filament configured to generate thermal electrons;
a cathode disposed at a first end of the arc chamber housing in the traveling direction and configured to generate secondary electrons in response to bombardment of the thermal electrons generated by the filament;
a repeller disposed at a second end, opposite to the first end, of the arc chamber housing in the traveling direction, wherein the repeller is movable with respect to the arc chamber housing; and
a first distance sensor attached to the arc chamber housing and configured to measure a consumption depth of the repeller in the traveling direction, a displacement of the repeller being determined based on the consumption depth of the repeller measured by the first distance sensor.

2. The ion generator of claim 1, further comprising:
a first driving mechanism coupled to the repeller and configured to move the repeller with respect to the arc chamber housing.

3. The ion generator of claim 2, wherein the first driving mechanism is coupled to the repeller through a shaft attached to the repeller.

4. The ion generator of claim 3, wherein the first driving mechanism is one of:
an actuator;
a rail;
a continuous track; and
a stepper motor.

5. The ion generator of claim 2, wherein the repeller is curved.

6. The ion generator of claim 1, wherein the consumption depth of the repeller is measured by:
measuring a first distance between the first distance sensor and the repeller at a first moment;

measuring a second distance between the first distance sensor and the repeller at a second moment after the first moment; and
calculating a difference between the first distance and the second distance.

7. The ion generator of claim 1, further comprising:
a second driving mechanism coupled to the cathode and configured to move the cathode with respect to the arc chamber housing.

8. The ion generator of claim 7, further comprising:
a second distance sensor attached to the arc chamber housing and configured to measure a consumption depth of the cathode in the traveling direction.

9. The ion generator of claim 8, wherein the consumption depth of the cathode is measured by:
measuring a first distance between the second distance sensor and the cathode at a first moment;
measuring a second distance between the second distance sensor and the cathode at a second moment after the first moment; and
calculating a difference between the first distance and the second distance.

10. The ion generator of claim 8, wherein a displacement of the cathode is determined based on the consumption depth of the cathode.

11. The ion generator of claim 10, wherein the displacement of the cathode is zero, and the displacement of the repeller is a sum of the consumption depth of the repeller and the consumption depth of the cathode.

12. The ion generator of claim 10, wherein the displacement of the repeller is zero, and the displacement of the cathode is a sum of the consumption depth of the repeller and the consumption depth of the cathode.

13. The ion generator of claim 10, wherein a sum of the displacement of the cathode and the displacement of the repeller is equal to a sum of the consumption depth of the repeller and the consumption depth of the cathode.

14. The ion generator of claim 1, wherein the first distance sensor is one of an ultrasonic distance sensor, an infrared (IR) distance sensor, and a laser distance sensor.

15. The ion generator of claim 1, wherein the first distance sensor is a Light Detection and Ranging (LiDAR) sensor.

16. An ion generator of an ion implanter, the ion generator comprising:
an arc chamber defined by an arc chamber housing extending in a traveling direction;
a filament configured to generate thermal electrons;
a cathode disposed at a first end of the arc chamber housing in the traveling direction and configured to generate secondary electrons in response to bombardment of the thermal electrons generated by the filament; and
a repeller disposed at a second end, opposite to the first end, of the arc chamber housing in the traveling direction, wherein the repeller is curved;
wherein the repeller is movable in the traveling direction to compensate for a consumption of at least one of the cathode and the repeller, a displacement of the repeller being determined based on a consumption depth measured by a distance sensor.

17. The ion generator of claim 16, wherein the repeller comprises:
a front surface facing the cathode; and
a back surface opposite to the front surface; and
wherein the front surface is a concave surface viewing from the cathode, and the back surface is a convex surface viewing toward the cathode.

18. The ion generator of claim 17, further comprising:

a first driving mechanism coupled to the repeller and configured to move the repeller with respect to the arc chamber housing.

19. A method for operating an ion generator of an ion implanter, the method comprising:

measuring a consumption depth of a cathode and a consumption depth of a repeller;

determining, based on the consumption depth of the cathode and the consumption depth of the repeller, at least one of a displacement of the repeller and a displacement of the cathode; and moving at least one of the cathode and the repeller in accordance with the at least one of the displacement of the repeller and the displacement of the cathode.

20. The method of claim 19, wherein the displacement of the cathode is zero, and the displacement of the repeller is a sum of the consumption depth of the cathode and the consumption depth of the repeller.

* * * * *